(12) United States Patent
Kim et al.

(10) Patent No.: US 8,178,639 B2
(45) Date of Patent: May 15, 2012

(54) POLYMER FOR FORMING ORGANIC ANTI-REFLECTIVE COATING LAYER

(75) Inventors: Hyun-Jin Kim, Hwaseong-Si (KR); Jae-Hyun Kim, Seoul (KR); Hyo-Jung Roh, Hwaseong-Si (KR); Man-Ho Han, Hwaseong-Si (KR); Dong-Kyu Ju, Hwaseong-Si (KR)

(73) Assignee: Dongjin Semichem Co., Ltd., Incheon (KR)

( * ) Notice: Subject to any disclaimer, the term of this patent is extended or adjusted under 35 U.S.C. 154(b) by 162 days.

(21) Appl. No.: 12/485,480

(22) Filed: Jun. 16, 2009

(65) Prior Publication Data

US 2010/0266967 A1    Oct. 21, 2010

(30) Foreign Application Priority Data

Jun. 16, 2008    (KR) ........................ 10-2008-0056453

(51) Int. Cl.
*G03F 7/20*    (2006.01)
*C08F 122/14*    (2006.01)
*C08L 31/00*    (2006.01)
*B05D 3/02*    (2006.01)

(52) U.S. Cl. .................... 526/318; 430/271.1; 430/324; 427/393.2; 524/558

(58) Field of Classification Search ........................ None
See application file for complete search history.

(56) References Cited

U.S. PATENT DOCUMENTS

| 6,156,479 | A | 12/2000 | Meador et al. | |
|---|---|---|---|---|
| 2006/0292489 | A1* | 12/2006 | Lee et al. | 430/270.1 |
| 2007/0224520 | A1* | 9/2007 | Ogata et al. | 430/5 |

FOREIGN PATENT DOCUMENTS

JP    09-078031 A    3/1997

OTHER PUBLICATIONS

"Phosphonic acids", from IUPAC goldlbook, PAC, year 1995, 67,1307 (Glossary of class names of organic compounds and reactivity intermediates based on structure (IUPAC Recommendations 1995)) on p. 1358 obtained from http://goldbook.iupac.org/index. html.one page.*

"Alcohols" from IUPAC gold book,PAC, 1995, 67, 1307 (Glossary of class names of organic compounds and reactivity intermediates based on structure (IUPAC Recommendations 1995)) on p. 1312, obtained from http://goldbook.iupac.org/index.html.one page.*

"Suflides", from IUPAC gold book, PAC, 1995, 67, 1307 (Glossary of class names of organic compounds and reactivity intermediates based on structure (IUPAC Recommendations 1995)) on p. 1368 obtained from http://goldbook.iupac.org/index.html.one page.*

* cited by examiner

*Primary Examiner* — Cynthia Hamilton
(74) *Attorney, Agent, or Firm* — Kile Park Goekjian Reed & McManus PLLC

(57) ABSTRACT

A polymer for forming an organic anti-reflective coating layer, which is soluble in alkali solutions so that an additional etching process of anti-reflective coating layer is not required, and a composition including the same are disclosed. The polymer for forming an organic anti-reflective coating layer has the following formula.

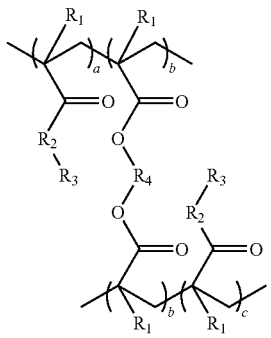

Wherein, $R_1$ is a hydrogen atom (H) or a methyl group ($-CH_3$), $R_2$ is a sulfur atom (S) or an oxygen atom (O), $R_3$ is a group containing 1 to 20 carbon atoms and a terminal hydroxyl group, $R_4$ is an alkylene group or a cycloalkylene group, and if necessary, a hetero atom is contained therein, and a, b and c independently represent weight % of repeating units constituting the polymer, and are 1 to 98 weight %, 1 to 98 weight %, and 1 to 98 weight %, respectively.

6 Claims, No Drawings

POLYMER FOR FORMING ORGANIC ANTI-REFLECTIVE COATING LAYER

This application claims the priority benefit of Korean Patent Application No. 10-2008-0056453 filed on Jun. 16, 2008. All disclosure of the Korean Patent application is incorporated herein by reference.

FIELD OF THE INVENTION

This invention relates to a polymer for forming an organic anti-reflective coating layer, and more particularly, to a polymer for forming an organic anti-reflective coating layer, which is soluble in alkali solutions, and composition including the same, so that an additional etching process of anti-reflective coating layer is not required.

BACKGROUNDS OF THE INVENTION

In a preparation of a semi-conductor device, fine patterns are formed by photolithography processes using photoresist to increase processing speed and capability. In the process using photoresist, to form fine patterns and a desired circuit, the effect of light on the patterns to be formed should be minimized by blocking the reflected or refracted light from the bottom. An anti-reflective coating layer (bottom anti-reflective coatings: BARCs) blocks the reflected or refracted light from the bottom, and thus the anti-reflective coating layer is indispensable to the photolithography process as the circuit is fine-sized.

The anti-reflective coating layer should be not dissolved in or mixed with solvent for photoresist which is coated on the anti-reflective coating layer. Therefore, the anti-reflective coating layer still remains after photoresist patterns are formed. An etching process of anti-reflective coating layer must be carried out first before etching a substrate on which the desired circuit is to be formed. The thickness of photoresist layer is getting thinner for minimizing circuit constantly. So, the thickness of remained anti-reflective coating layer makes the etching process of the substrate difficult. Moreover, after etching the anti-reflective coating layer, the etching process of substrate comes to a difficult state to be carried out. If an anti-reflective coating layer which can be patterned with photoresist at the same time is applied, the etching process of the anti-reflective coating layer can be eliminated, so that in the etching process of substrate, the difficulty of etching is reduced. Therefore, the above mentioned process is more advantageous in view of the process and cost over the process using a conventional anti-reflective coating layer. This trend is shown in U.S. Pat. No. 6,156,479 and Japanese Patent Publication No. 9-78031, but the disclosures have disadvantages that the formation of fine patterns and the control of reaction are difficult.

SUMMARY OF THE INVENTION

Therefore, it is an object of the present invention to provide a polymer for forming an organic anti-reflective coating layer, which is soluble in alkali solutions so that an additional etching process of anti-reflective coating layer is not required, and composition including the same. It is another object of the present invention to provide a polymer for forming organic anti-reflective coating layer which is prepared by a simple process and is available with low cost, and composition including the same.

In order to achieve these objects, the present invention provides a polymer for forming an organic anti-reflective coating layer, containing a repeat unit represented by the following Formula 1,

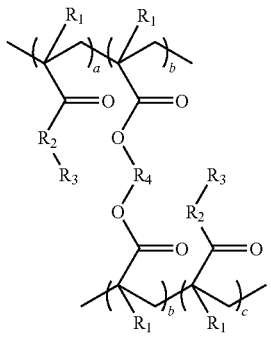

Wherein, $R_1$ is a hydrogen atom (H) or a methyl group (—$CH_3$), $R_2$ is a sulfur atom (S) or an oxygen atom (O), $R_3$ is a group containing 1 to 20 carbon atoms and a terminal hydroxyl group, $R_4$ is an alkylene group or a cycloalkylene group, and if necessary, a hetero atom is contained therein, and a, b and c independently represent weight % of repeating units constituting the polymer, and are 1 to 98 weight %, 1 to 98 weight %, and 1 to 98 weight %, respectively.

The present invention also provides a composition for forming an organic anti-reflective coating layer comprising: 0.1 to 69.9 weight % of the polymer for forming the organic anti-reflective coating layer, containing a repeat unit represented by Formula 1; 0.1 to 30 weight % of a light absorber which absorbs an exposure light; 30 to 99.8 weight % of organic solvent which dissolves the polymer for forming the organic anti-reflective coating layer.

DETAILED DESCRIPTION OF THE INVENTION

A more complete appreciation of the invention, and many of the attendant advantages thereof, will be better appreciated by reference to the following detailed description.

The polymer for forming an organic anti-reflective coating layer according to the present invention is represented by the following Formula 1,

[Formula 1]

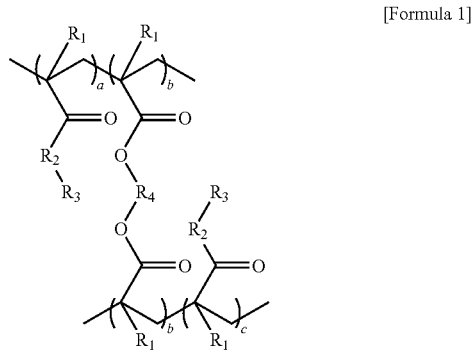

Wherein, $R_1$ is a hydrogen atom (H) or a methyl group (—$CH_3$), and $R_2$ is a sulfur atom (S) or an oxygen atom (O). $R_3$ is a group containing 1 to 20 carbon atoms and a terminal hydroxyl group, preferably an alkyl group of 1 to 20 carbon atoms, containing a hydroxyl group (—OH), more preferably a linear type, a branched type or a ring type alkyl group of 1 to 20 carbon atoms, containing a hydroxyl group (—OH), and if necessary, a hetero atom such as a sulfur atom (S) can be contained therein. $R_4$ is an alkylene group or a cycloalkylene group, and if necessary, a hetero atom is contained therein, preferably a linear type, a branched type or a ring type alkylene group of 1 to 20 carbon atoms, and if necessary, a hetero atom such as a sulfur atom (S) can be contained therein. And a, b and c independently represent weight % of repeating units constituting the polymer, and are 1 to 98 weight %, 1 to 98 weight %, and 1 to 98 weight %, preferably 1 to 90 weight %, 1 to 98 weight %, and 1 to 90 weight %, more preferably 1 to 50 weight %, 5 to 90 weight %, and 1 to 50 weight %, respectively.

The representative example of $R_3$ is

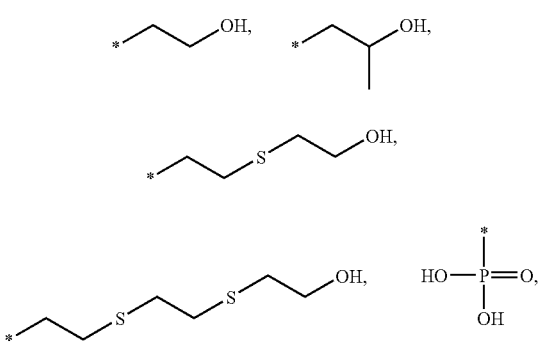

and so on. The representative example of $R_4$ is

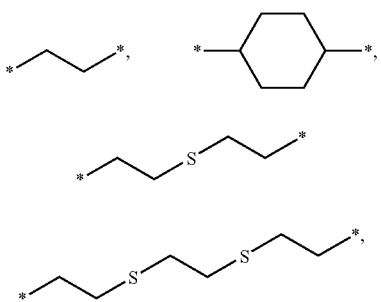

and so on (wherein, * indicates a bonding part).

The polymer for forming the organic anti-reflective coating layer represented by the Formula 1 can be prepared by the following steps. (i) A glycol compound comprising $R_4$ is reacted with paraformaldehyde and hydrochloride (HCl) gas to obtain glycol dimethylene chloride monomer comprising $R_4$, and the monomer is reacted with methacrylic acid and triethylamine (TEA) to obtain unsaturated ethylene monomer comprising $R_4$. (ii) A glycol compound comprising $R_4$ is reacted with methacrylic acid halide and triethylamine (TEA) to obtain unsaturated ethylene monomer comprising $R_2$ and $R_3$. And the polymer can be prepared by polymerization of the product of the reaction (i) and the product of the reaction (ii).

The example of the glycol compound comprising $R_4$ includes

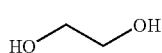
[Formula 2a]

[Formula 2b]

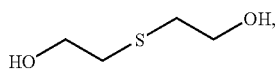
[Formula 2c]

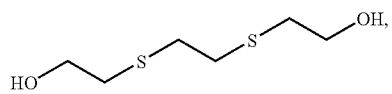
[Formula 2d]

and so on.

The example of the glycol dimethylene chloride monomer comprising $R_4$ includes

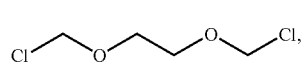
(Formula 3a)

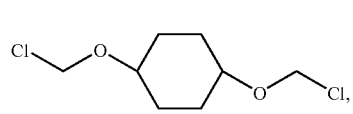
(Formula 3b)

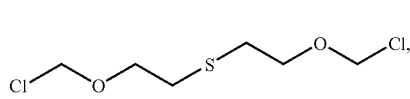
(Formula 3c)

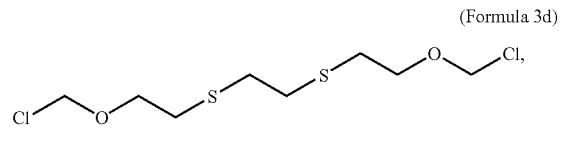
(Formula 3d)

and so on.

The example of the unsaturated ethylene monomer comprising $R_4$ includes

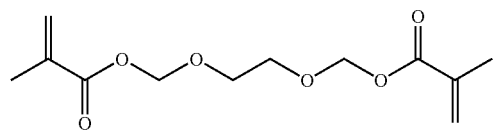
(Formula 4a),

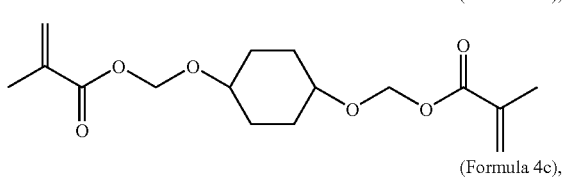
(Formula 4b),

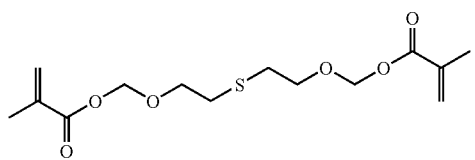
(Formula 4c),

-continued (Formula 4d),

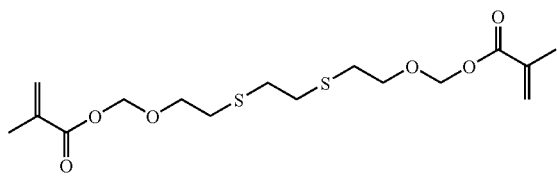

and so on.

The example of the unsaturated ethylene monomer comprising $R_2$ and $R_3$ includes (Formula 5a)

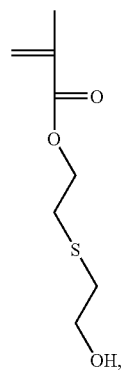

(Formula 5b)

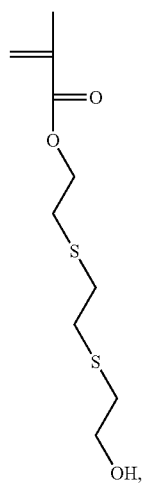

(Formula 5c)

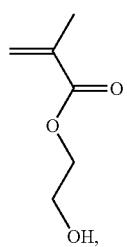

and so on.

The polymer for forming an organic anti-reflective coating layer can be synthesized by conventional polymerization reactions such as a radical polymerization, a bulk polymerization, and so on. The radical polymerization in solution can be carried out by, for example, dissolving each oxirane monomers in polymerization solvent, adding polymerization initiator, and polymerizing the reactants under the atmosphere of nitrogen or argon. As the polymerization solvent, a conventional polymerization solvent can be used widely, for example, cyclohexanone, cyclopentanone, tetrahydrofuran (THF), dimethyl formamide, dimethyl sulfoxide, dioxane, methyl ethyl ketone, benzene, toluene, xylene, and mixture thereof. As the polymerization initiator, conventional polymerization initiators can be used widely, for example, benzoyl peroxide, 2,2'-azobisisobutyronitrile (AIBN), acetyl peroxide, lauryl peroxide, t-butyl peracetate, t-butyl hyperoxide, di-t-butylperoxide and mixture thereof.

The weight-average molecular weight of the polymer for forming an organic anti-reflective coating layer according to the present invention is preferably 1,000 to 100,000, more preferably 5,000 to 30,000. If the molecular weight is less than 1,000, the organic anti-reflective coating layer can be dissolved by a photoresist solvent. If the molecular weight is more than 100,000, a solubility of the composition for forming an organic anti-reflective coating layer to a solvent may decrease. The polymer represented by the Formula 1 has a characteristic that a small scale molecular structure which can be changed to the molecular structure soluble in developer by acid is introduced in the polymer chain. Therefore the formation of molecular scale fine pattern is available, and the anti-reflective coating layer is soluble in alkali solutions and can be patterned with photoresist at the same time.

The composition for forming an organic anti-reflective coating layer according to the present invention includes the polymer for forming an organic anti-reflective coating layer, a light absorber and a solvent. In the composition according to the present invention, the amount of the polymer for forming an organic anti-reflective coating layer is 0.1 to 69.9 weight %, preferably 1 to 48 weight %, more preferably 1 to 30 weight %. If the amount of the polymer is less than 0.1 weight %, or more than 69.9 weight %, the organic anti-reflective coating layer cannot be formed, or the properties of the formed organic anti-reflective coating layer such as uniformity may be deteriorated. The composition for forming an organic anti-reflective coating layer according to the present invention can further include conventional polymers and cross-linking agents to improve the coating property of the composition and to increase the bonding ability of the anti-reflective coating layer by thermal curing and so on. The non-limiting example of the polymers includes acrylate, methacrylate, styrene, oxyalkylene, and so on.

The light absorber absorbs the light reflected from an etching layer of semi-conductor substrate in a photolithography process, and prevents the problems such as an undercutting and a notching by the reflected light. As the light absorber, any conventional light absorber can be used. As the representative example of the light absorber, the light absorber which is disclosed in Korean Patent Application No. 2004-76011 can be used, for example,

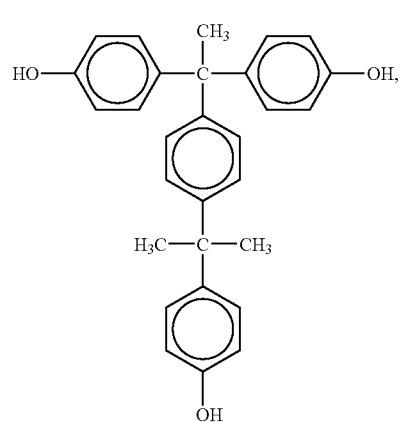
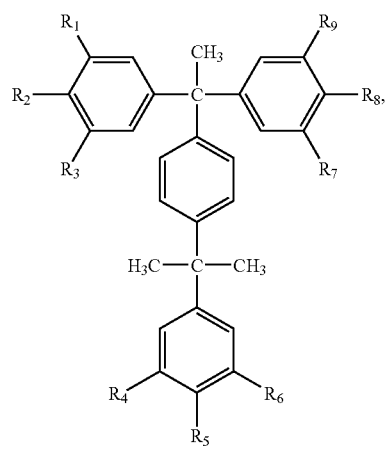
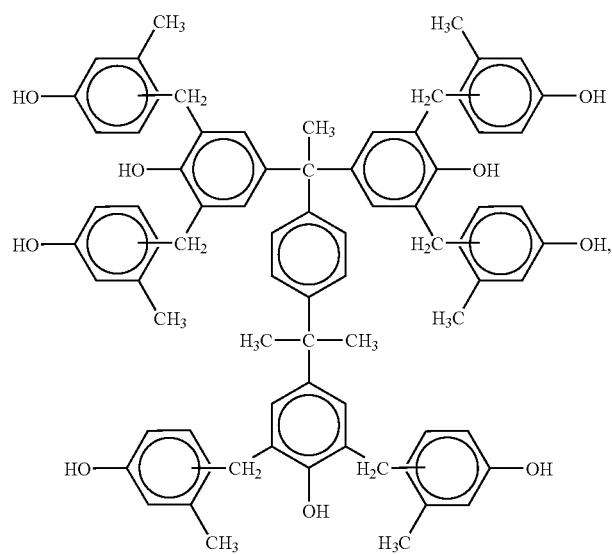
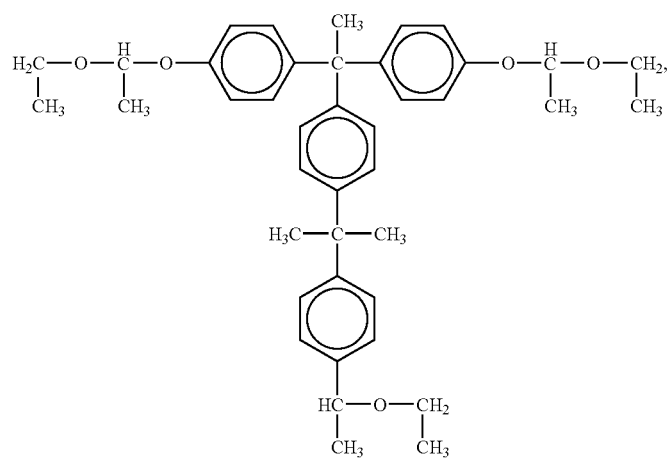

-continued
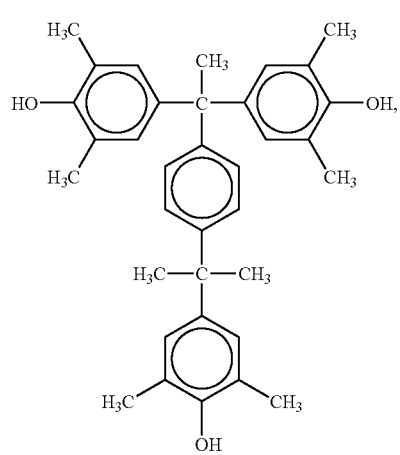
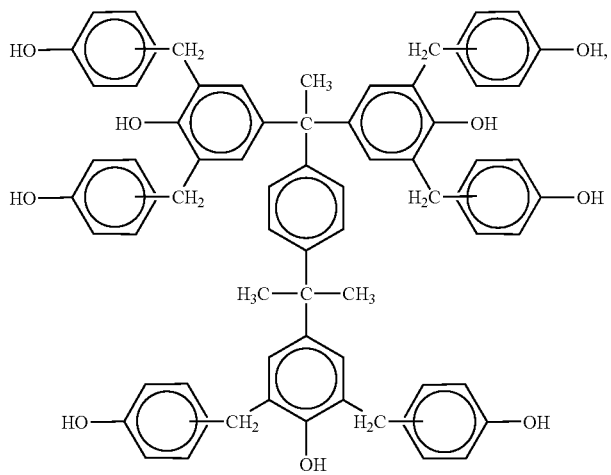
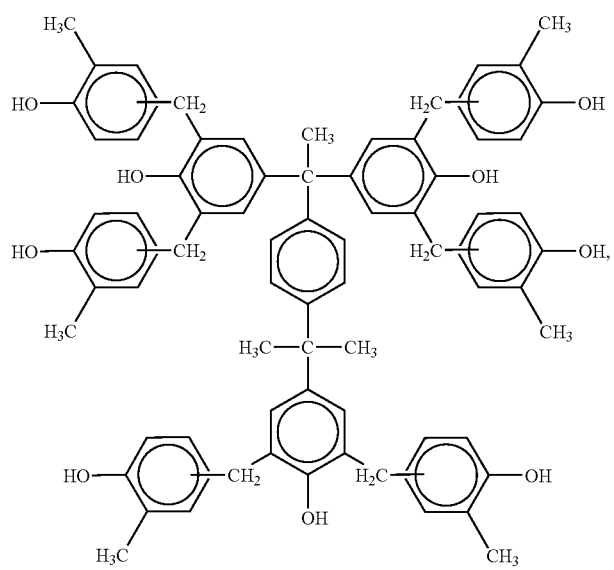
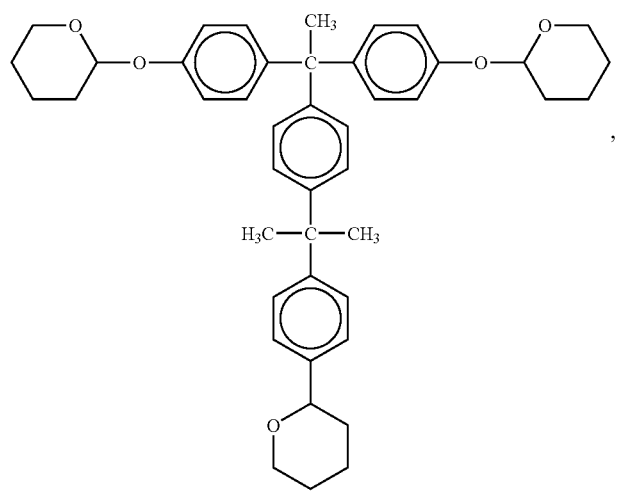

-continued
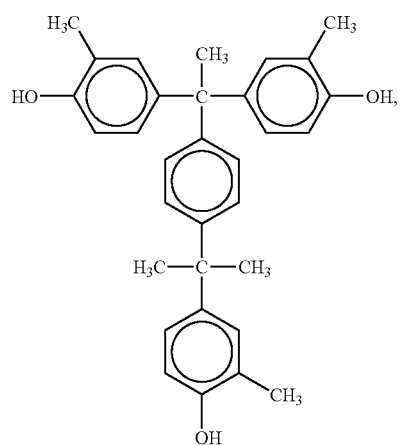
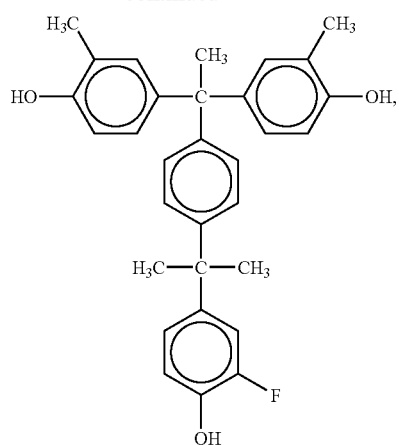
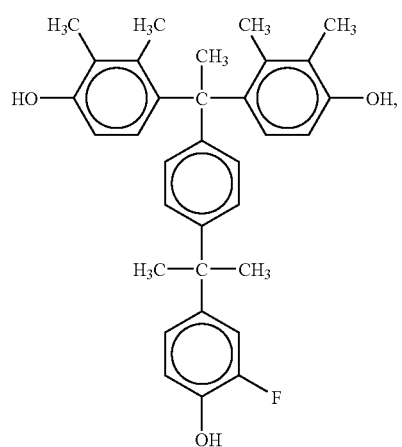
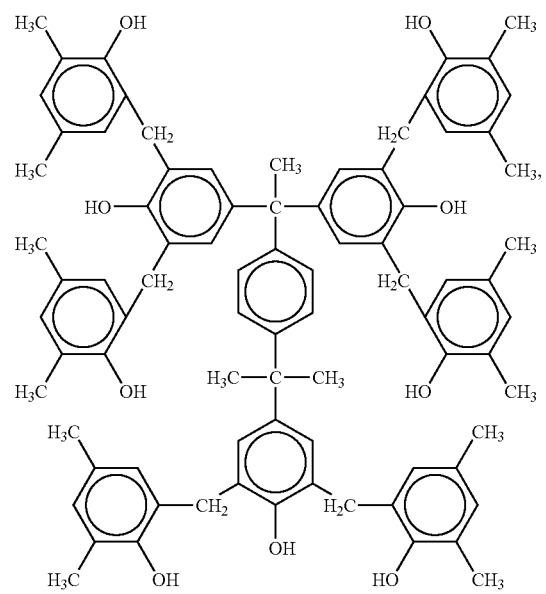
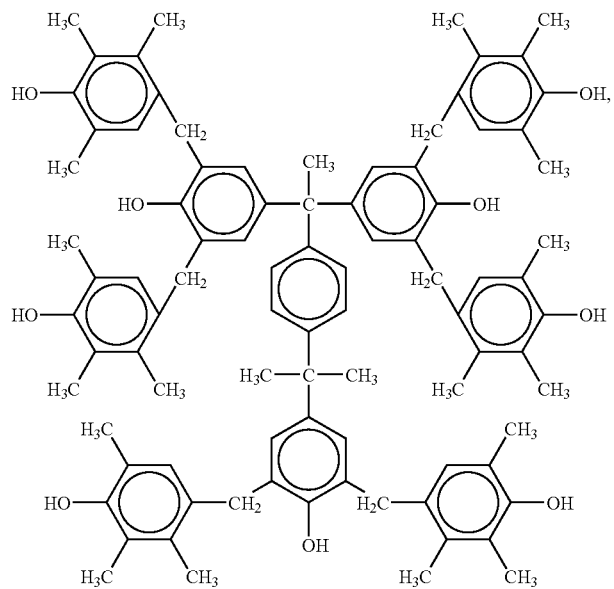

-continued
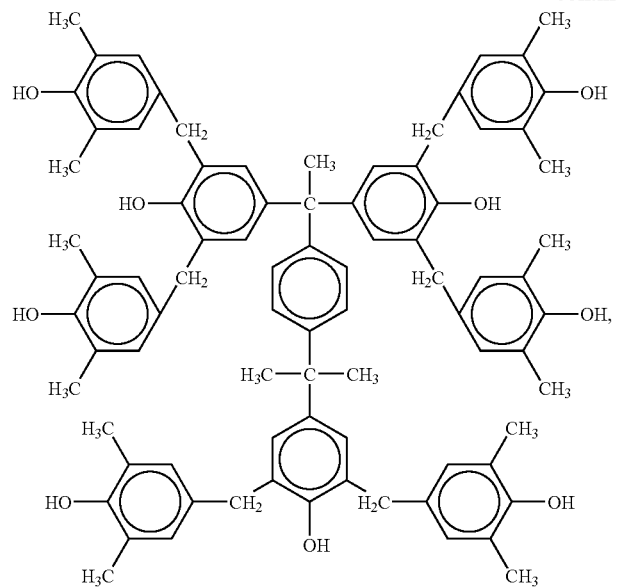
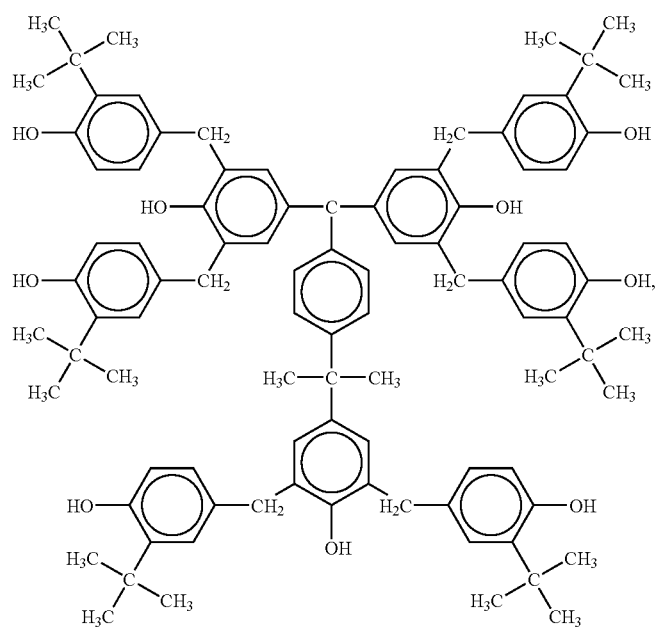

-continued
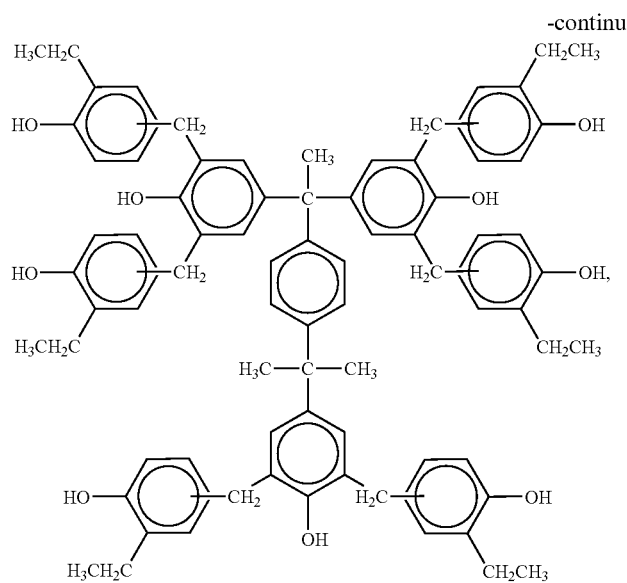
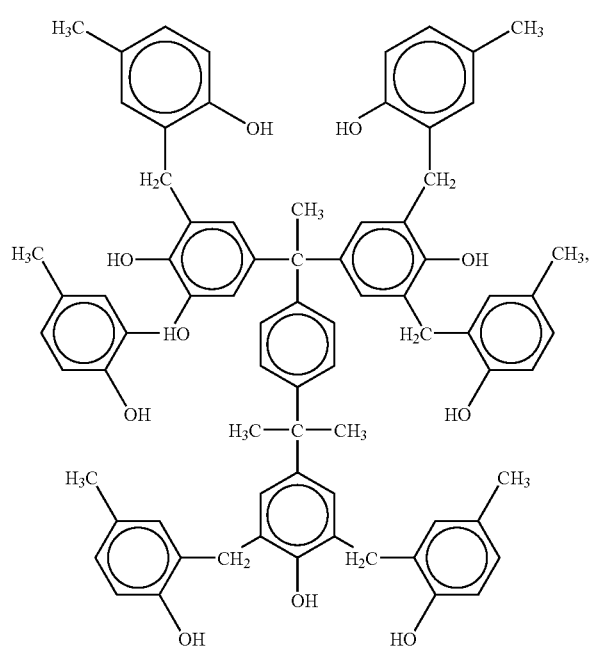

-continued
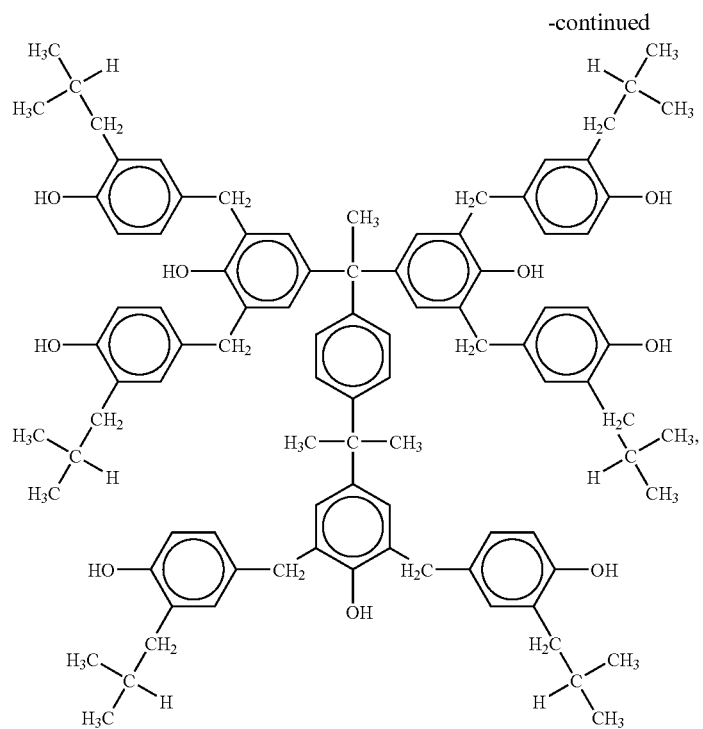
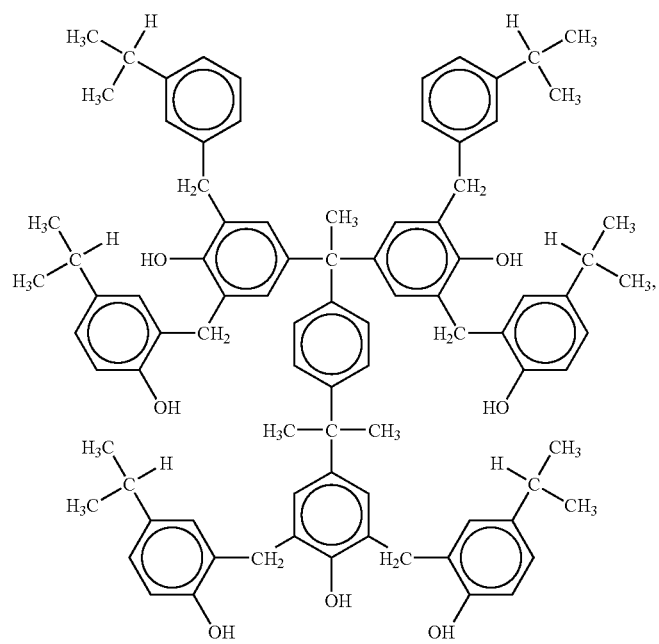

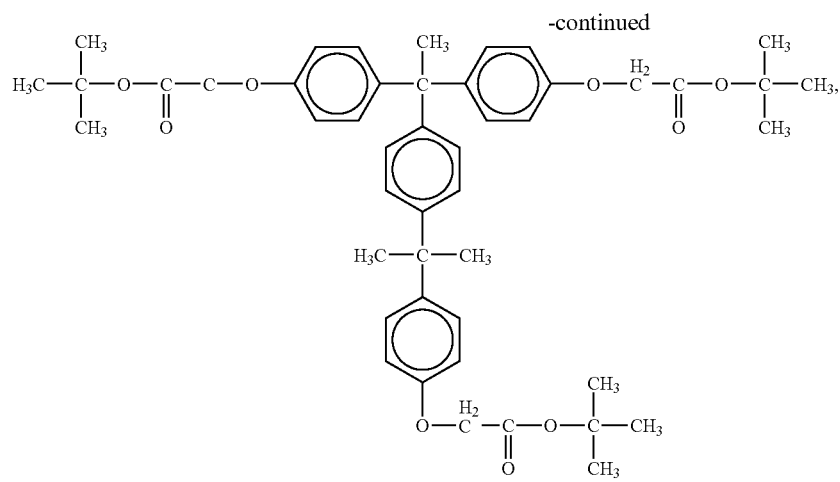
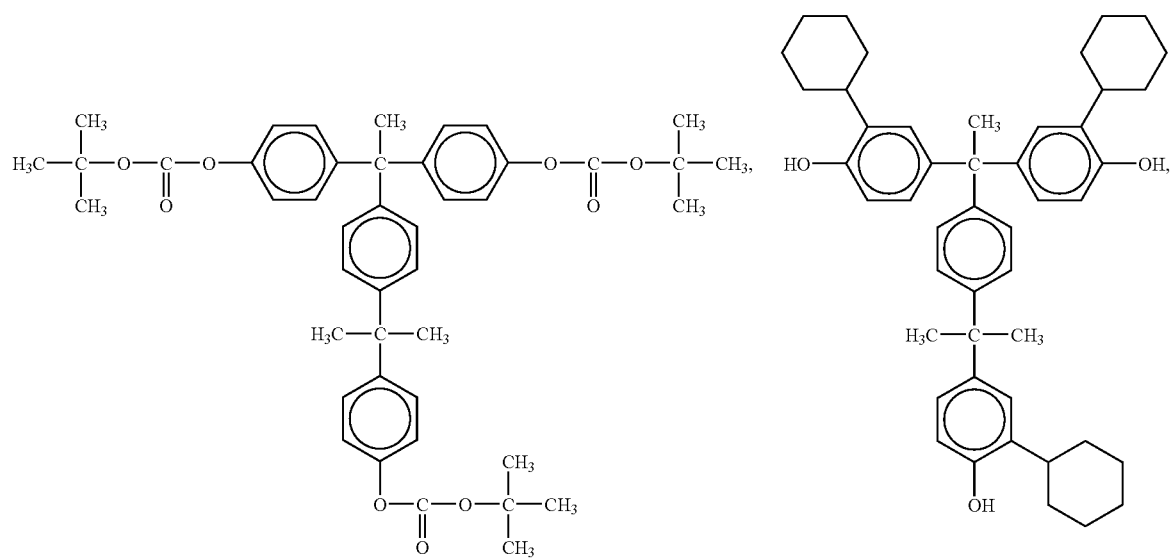
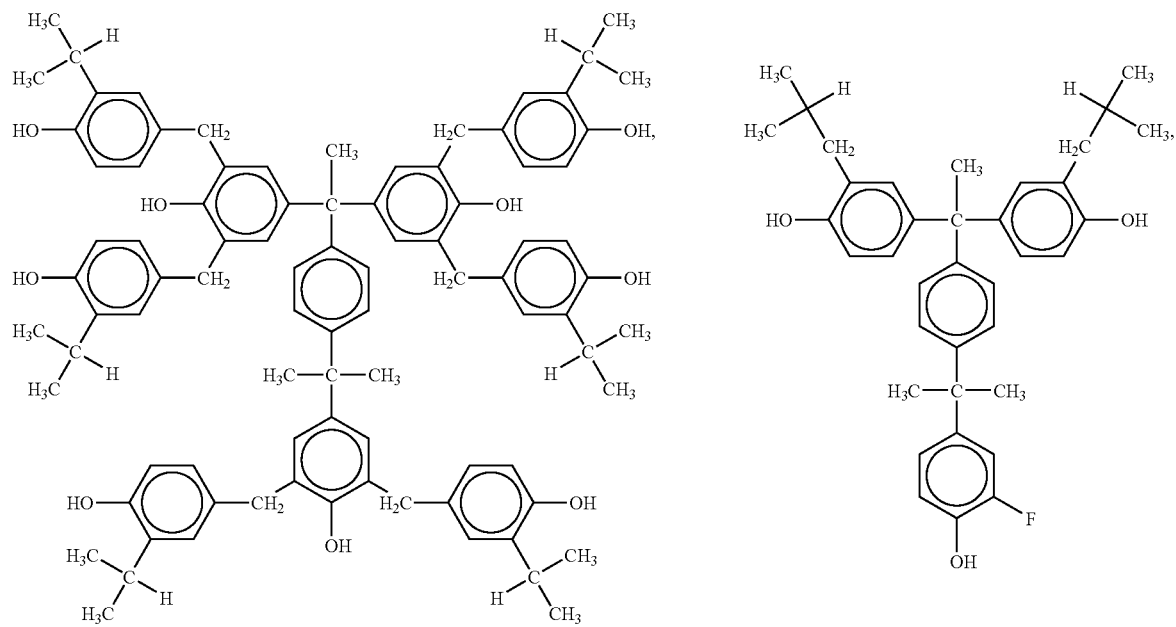

and so on. The amount of the light absorber is 0.1 to 30 weight %, preferably 1 to 20 weight % with respect to the total amount of the composition for forming an organic anti-reflective coating layer. If the amount of the light absorber is less than 0.1 weight %, the absorptivity of exposure light is low, and an undercutting, a notching, and so on can occur on photoresist patterns. If the amount of the light absorber is more than 30 weight %, fume is generated in a heating process such as a firing, and the coating apparatus can be spoiled. The light absorber has the bulky structure, therefore there is no excessive contraction in a photocrosslinking process. As a plasticizer the light absorber improves coating uniformity even on a rough semi-conductor substrate. And the compatibility with polymers, the solubility in organic solvents, and the crosslinking reactivity with the photocrosslinking agents are superior, therefore anti-reflective coating layer whose thickness loss by photoresist solvent is rare can be formed. The light absorber has a high coefficient of extinction and absorbance for ArF exposure light source, therefore can be used effectively in the case of using highly reflective semi-conductor substrate.

As the organic solvent, conventional organic solvents for the composition for forming an organic anti-reflective coating layer can be used widely, for example, butyrolactone, cyclopentanone, cyclopentanone, dimethyl acetamide, dimethyl formamide, dimethyl sulfoxide, N-methylpyrrolidone, tetrahydro furfural alcohol, propyleneglycol monomethylether (PGME), propyleneglycol monomethylether acetate (PGMEA), ethyllactate or mixtures thereof, preferably propyleneglycol monomethylether, propyleneglycol monomethylether acetate, ethyllactate or mixtures thereof. The amount of the organic solvent is 30 to 99.8 weight %, preferably 40 to 98 weight % with respect to the total amount of the composition for forming an organic anti-reflective coating layer. If the amount of the organic solvent is less than 30 weight %, the thickness of the organic anti-reflective coating layer may be non-uniform. If the amount of the organic solvent is more than 99.8 weight %, the property of the formed organic anti-reflective coating layer such as the absorbance of an exposure light source and so on may be deteriorated. Moreover, the composition for forming an organic anti-reflective coating layer according to the present invention can further include a cross-linking accelerator such as a cross-linking agent, a low molecular weight alcohol, an acid, or an acid generator, a leveling agent, an adhesion promoter, an anti-foaming agent, other additives, and so on.

To form the organic anti-reflective coating layer with the composition of the present invention, the composition for forming the organic anti-refractive coating layer is applied on an etching layer such as a silicon wafer, an aluminum plate, and so on, and the applied composition is cured by heating. The process of applying the composition for forming the organic anti-reflective coating layer on the etching layer is carried out by conventional methods such as spin coating, roller coating and so on. Moreover, the thermal curing process is carried out by heating the applied composition in an apparatus such as a high-temperature plate, a convection oven, and so on. The thermal curing process can be preferably carried out at 90 to 240° C. If the thermal curing temperature is less than 90° C., the solvent included in the composition for forming the organic anti-reflective coating layer can be not removed sufficiently. If the thermal curing temperature is more than 240° C., the composition for forming an organic anti-reflective coating layer and the organic anti-reflective coating layer can be chemically unstable.

The method for forming semi-conductor device patterns by using the composition for forming the organic anti-reflective coating layer according to the present invention comprises the step of: applying the composition for forming the organic anti-reflective coating layer on an etching layer (a layer to be etched); forming the organic anti-reflective coating layer by thermal curing the composition for forming the organic anti-reflective coating layer applied on the etching layer; forming patterns of the organic anti-reflective coating layer and photoresist by applying a photoresist composition on the organic anti-reflective coating layer to form a photoresist layer, by exposing the organic anti-reflective coating layer and the photoresist layer to an exposure light of a predetermined pattern, and by developing the exposed organic anti-reflective coating layer and photoresist layer; and forming etching layer patterns by etching the etching layer using formed patterns of the organic anti-reflective coating layer and photoresist as an etching mask.

Wherein, the step of forming patterns of the organic anti-reflective coating layer and photoresist is the same as the step of forming conventional photoresist patterns. The polymer for forming an organic anti-reflective coating layer has a characteristic that a small scale molecular structure which can be changed to the molecular structure soluble in developer by acid is introduced in the polymer chain. Therefore an etching process of the anti-reflective coating layer can be eliminated because the formation of molecular scale fine patterns is available, and the anti-reflective coating layer is soluble in alkali solutions and can be patterned with photoresist. Therefore, in the step of layer patterning, the difficulty of etching is reduced, and the above mentioned process is more advantageous in view of the process and cost over the process of a conventional anti-reflective coating layer.

Moreover, the etching process can be carried out by a conventional dry etching process. The patterns on semi-conductor devices are formed by removing the etching layer of semi-conductor substrate in the etching process.

Hereinafter, examples and comparative examples are provided to illustrate the present invention in more detail, but the present invention is not restricted or limited by the following examples and comparative examples.

Manufacturing Example 1-1

Preparation of the Monomer Represented by Formula 3a

As shown in the following Reaction 1, 100 g (1.53 mol) of ethylene glycol which is glycol compound comprising $R_4$ and represented by Formula 2a, and 100.1 g (3.3 mol) of paraformaldehyde were added into a 1000 mL round reaction flask, and stirred with injecting 2 to 3 equivalent of hydrochloride (HCl) gas until the reactants became transparent solution. After completion of the reaction, 500 mL of hexane was added to the transparent solution and stirred for 30 minutes, and then, the solution was placed in a separatory funnel, and the separated water which was generated by dehydration was removed from the solution, and saturated sodium bicarbonate aqueous solution was slowly added for the neutral pH. 500 mL of distilled water was added in the solution, and extracted 3 times with 500 mL of hexane. The extracted solution was dried with magnesium sulfate anhydrous and distillated under reduced pressure, to obtain 180 g of the monomer represented by Formula 3a {Yield: 74%, $^1$H-NMR (CDCl$_3$, internal standard): δ (ppm) 5.54 (s, 4H), 3.86 (s, 4H)}.

[Reaction 1]

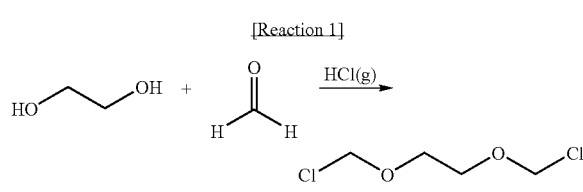

Manufacturing Example 1-2

Preparation of the Monomer Represented by Formula 3b

Except for using 100 g of the compound represented by Formula 2b instead of 100 g of the compound represented by Formula 2a, the reaction was carried out in the same manner as described in Manufacturing Example 1-1 to obtain 170 g of the monomer represented by Formula 3b {Yield: 70%, $^1$H-NMR (CDCl$_3$, internal standard): δ(ppm) 5.65 (s, 4H), 2.78 (s, 2H)}.

Manufacturing Example 1-3

Preparation of the Monomer Represented by Formula 3c

Except for using 100 g of the compound represented by Formula 2c instead of 100 g of the compound represented by Formula 2a, the reaction was carried out in the same manner as described in Manufacturing Example 1-1 to obtain 150 g of the monomer represented by Formula 3c {Yield: 62%, $^1$H-NMR (CDCl$_3$, internal standard): δ(ppm) 5.56 (s, 4H), 4.29 (s, 4H), 3.86 (s, 4H)}.

Manufacturing Example 1-4

Preparation of the Monomer Represented by Formula 3d

Except for using 100 g of the compound represented by Formula 2d instead of 100 g of the compound represented by Formula 2a, the reaction was carried out in the same manner as described in Manufacturing Example 1-1 to obtain 160 g of the monomer represented by Formula 3d {Yield: 67%, $^1$H-NMR (CDCl$_3$, internal standard): δ(ppm) 6.05 (s, 4H), 5.46 (s, 4H), 4.21 (s, 4H), 3.76 (s, 4H)}.

Manufacturing Example 2-1

Preparation of the Monomer Represented by Formula 4a

As shown in the following Reaction 2, 150 g (0.90 mol) of ethylene glycol dimethylene chloride which is the monomer represented by the Formula 3a and 1000 mL of tetrahydrofuran (THF) were added into a 3000 mL 3-neck round bottom flask and stirred at 0° C. The solution of 195 g (1.8 mol) of triethylamine (TEA) dissolved in 500 mL of tetrahydrofuran (THF) and the solution of 166 g (1.9 mol) of methacrylic acid dissolved in 500 mL of tetrahydrofuran (THF) were prepared. Then these solutions were slowly and dropwise added to the flask, and the reaction was carried out for 12 hours. After completion of the reaction, the generated salt was removed by filtration under reduced pressure, and tetrahydrofuran (THF) was removed from the filtrate by distillation under reduced pressure. The product was extracted 3 times using 1500 mL of methylene chloride and 500 mL of distilled water. The extracted solution was dried with magnesium sulfate anhydrous and distillated under reduced pressure, to obtain 210 g of the monomer represented by Formula 4a {Yield: 91%, $^1$H-NMR (CDCl$_3$, internal standard): δ(ppm) 6.18 (s, 2H), 5.3 (s, 2H), 5.44 (s, 4H), 3.83 (s, 4H), 1.96 (s, 6H)}.

[Reaction 2]

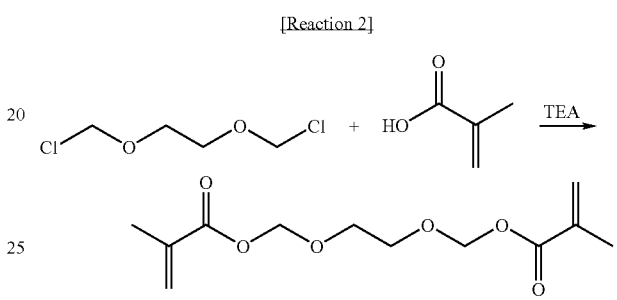

Manufacturing Example 2-2

Preparation of the Monomer Represented by Formula 4b

Except for using 100 g of the compound represented by Formula 3b instead of 100 g of the compound represented by Formula 3a, the reaction was carried out in the same manner as described in Manufacturing Example 2-1 to obtain 200 g of the monomer represented by Formula 4b {Yield: 87%, $^1$H-NMR (CDCl$_3$, internal standard): δ(ppm) 6.14 (s, 2H), 5.24 (s, 2H), 5.45 (s, 4H), 3.78 (s, 4H), 1.95 (s, 6H)}.

Manufacturing Example 2-3

Preparation of the Monomer Represented by Formula 4c

Except for using 100 g of the compound represented by Formula 3c instead of 100 g of the compound represented by Formula 3a, the reaction was carried out in the same manner as described in Manufacturing Example 2-1 to obtain 195 g of the monomer represented by Formula 4c {Yield: 85%, $^1$H-NMR (CDCl$_3$, internal standard): δ(ppm) 6.15 (s, 2H), 5.31 (s, 2H), 5.42 (s, 4H), 3.81 (s, 4H), 1.96 (s, 6H)}.

Manufacturing Example 2-4

Preparation of the Monomer Represented by Formula 4d

Except for using 100 g of the compound represented by Formula 3d instead of 100 g of the compound represented by Formula 3a, the reaction was carried out in the same manner as described in Manufacturing Example 2-1 to obtain 205 g of the monomer represented by Formula 4d {Yield: 89%, ¹H-NMR (CDCl₃, internal standard): 6(ppm) 6.19 (s, 2H), 5.34 (s, 2H), 5.46 (s, 4H), 3.84 (s, 4H), 1.94 (s, 6H)}.

Manufacturing Example 3-1

Preparation of the Monomer Represented by Formula 5a

As shown in the following Reaction 3, 30 g (0.256 mol) of the compound represented by the Formula 2c, 27 g (0.268 mol) of triethylamine (TEA) and 340 mL of tetrahydrofuran (THF) were added into a 500 mL 2-neck round bottom flask and cooled with an ice water, and 25.43 mL (0.253 mol) of methacryloyl chloride was slowly and dropwisely added. After adding, the temperature of the reactants was raised to the room temperature, and the reaction was carried out for 20 hours. After completion of the reaction, salt as byproduct was removed by filtration, and unreacted triethylamine and methacryloyl chloride were removed by washing with deionized water (DIW). And then, the product was dried with magnesium sulfate anhydrous and tetrahydrofuran (THF) was removed by distillation under reduced pressure, and the remainder was vacuum-dried to obtain 25 g of the monomer represented by Formula 5a {Yield: 78%, ¹H-NMR (CDCl₃, internal standard): CH₃(1.93), CH₂(4.52, 2.72, 2.63), H(6.15, 5.58)}.

[Reaction 3]

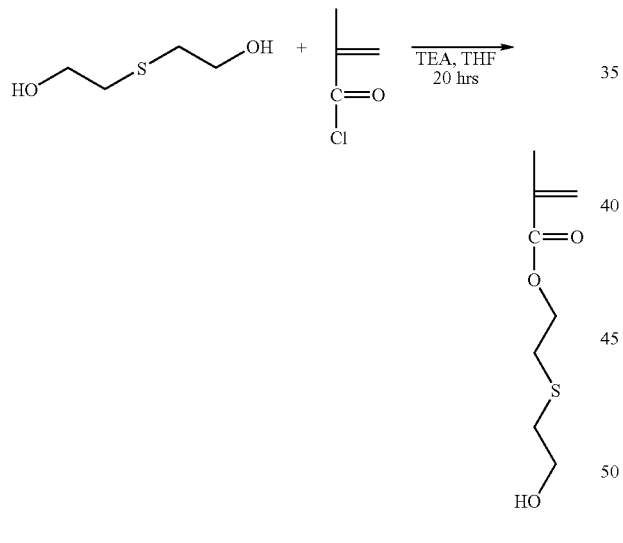

Manufacturing Example 3-2

Preparation of the Monomer Represented by Formula 5b

Except for using 30 g of the compound represented by Formula 2d instead of 30 g of the compound represented by Formula 2c, the reaction was carried out in the same manner as described in Manufacturing Example 3-1 to obtain 23 g of the monomer represented by Formula 5b {Yield: 72%, ¹H-NMR (CDCl₃, internal standard): CH₃(1.93), CH₂(4.52, 2.72, 2.81, 2.63), H(6.15, 5.58)}.

Manufacturing Example 3-3

Preparation of the Monomer Represented by Formula 5c

Except for using 30 g of the compound represented by Formula 2a instead of 30 g of the compound represented by Formula 2c, the reaction was carried out in the same manner as described in Manufacturing Example 3-1 to obtain 28 g of the monomer represented by Formula 5c {Yield: 88%, ¹H-NMR (CDCl₃, internal standard): CH₃(1.94), CH₂(4.26, 3.86, 2.34), H(6.13, 50.59)}.

Example 1-1

Preparation of the Polymer Represented by Formula 6a 20 g (0.110 mol) of the monomer represented by Formula 5c, 11.78 g (0.047 mol) of the monomer represented by Formula 4a, 1.59 g (0.010 mol) of 2,2'-azobisisobutyronitrile (AIBN) and 130 mL of tetrahydrofuran (THF) were added into a 250 mL 2-neck flask with a magnetic stirring bar, and the reaction was carried out at 65° C. for 24 hours. After completion of the reaction, the reaction product was precipitated into 1.5 L of n-hexane, and filtrated and dried to obtain 16 g of the polymer represented by the following Formula 6a (Yield: 65%, Molecular weight: 12,800, Polydispersity: 2.12). Hereinafter, in each polymer represented by 6a to 6d, a, b and c which are weight % of repeating unit are directly proportional to weight % of each monomer used.

[Formula 6a]

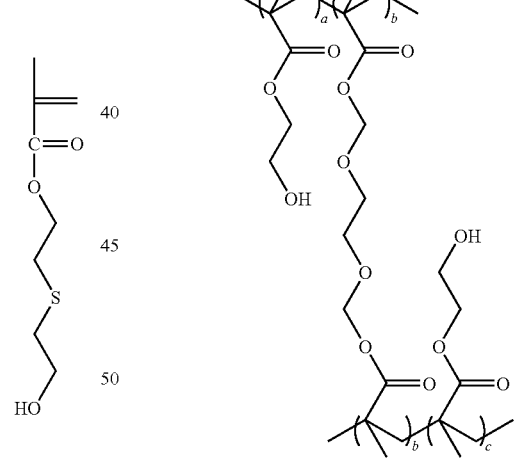

Example 1-2

Preparation of the Polymer Represented by Formula 6b

Except for using 12.00 g (0.047 mol) of the compound represented by Formula 4b instead of 11.78 g (0.047 mol) of the compound represented by Formula 4a, the reaction was carried out in the same manner as described in Example 1-1 to obtain 14 g of the polymer represented by the following Formula 6b (Yield: 60%, Molecular weight: 13,500, Polydispersity: 2.25).

[Formula 6b]

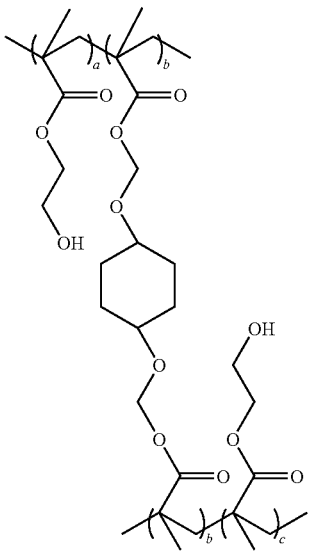

Example 1-3

Preparation of the Polymer Represented by Formula 6c

Except for using 14.50 g (0.047 mol) of the compound represented by Formula 4c instead of 11.78 g (0.047 mol) of the compound represented by Formula 4a, the reaction was carried out in the same manner as described in Example 1-1 to obtain 14.5 g of the polymer represented by the following Formula 6c (Yield: 60%, Molecular weight: 12,500, Polydispersity: 2.18).

[Formula 6c]

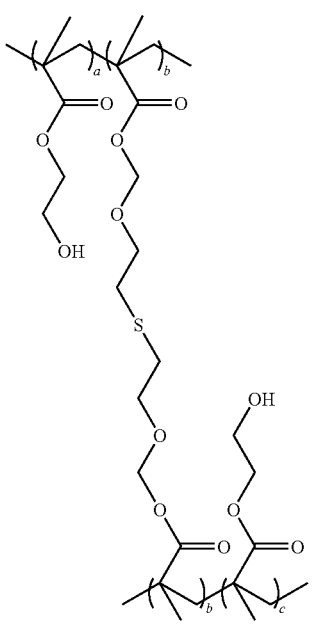

Example 1-4

Preparation of the Polymer Represented by Formula 6d

Except for using 15.00 g (0.046 mol) of the compound represented by Formula 4d instead of 11.78 g (0.047 mol) of the compound represented by Formula 4a, the reaction was carried out in the same manner as described in Example 1-1 to obtain 14.5 g of the polymer represented by the following Formula 6d (Yield: 55%, Molecular weight: 12,000, Polydispersity: 2.43).

[Formula 6d]

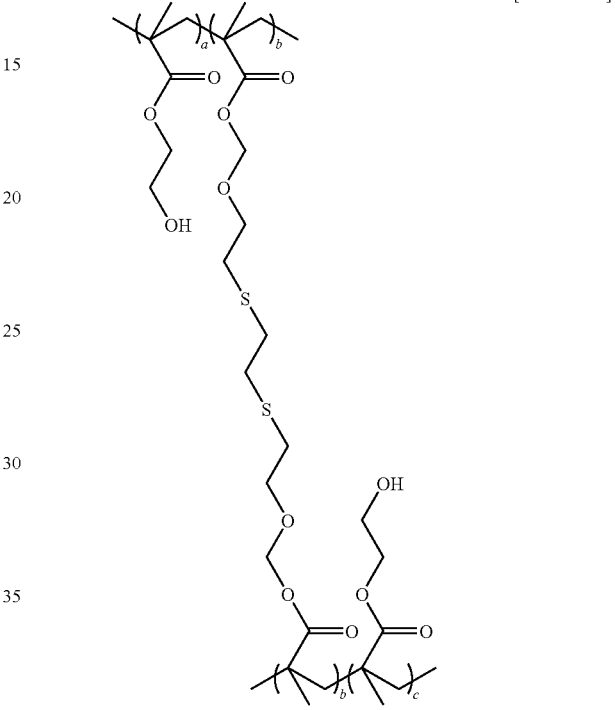

Examples 2-1 to 2-5 and Comparative Examples 1-1 to 1-2

Preparation of a Composition for Forming an Organic Anti-Reflective Coating Layer, and Forming an Organic Anti-Reflective Coating Layer As the composition shown in the following Table 1, 0.13 g of the polymer for forming an organic anti-reflective coating layer prepared in the Examples 1-1 to 1-4 (Formulas 6a to 6d), 0.06 g of the crosslinker (crosslinking agent) represented by the following Formulas 7a to 7c, 0.01 g of acid generator (product name: TAG-2678, maker: King Industries, Inc) represented by the following Formula 8, and 0.091 g of a light absorber were dissolved in 13.7 g of propyleneglycol monomethylether acetate (PGMEA), and stirred to obtain the composition for forming an organic anti-reflective coating layer (Examples 2-1 to 2-5). And except for using the conventional polymer for forming an organic anti-reflective coating layer represented by Formula 9 instead of the above mentioned polymer for forming an organic anti-reflective coating layer, the preparations were carried out in the same manner as described in Examples 2-1 to 2-5 to obtain the composition for forming an organic anti-reflective coating layer (Comparative Examples 1-1 to 1-2).

The composition for forming an organic anti-reflective coating layer was spin-coated on the etching layer such as a silicon wafer, and was baked at 240° C. for 90 seconds, to form 240 Å thickness of organic anti-reflective coating layer. Refractive index (m, real part) and absorbance (k, imaginary part) of the organic anti-reflective coating layer are measured by ellipsometer at 193 nm of wavelength, and are shown in the following Table 1. After measuring the thickness of the film with Nanospec, the film was dipped in the PGMEA solvent for 60 seconds, spined at 2000 rpm for 30 seconds, and heated at 100° C. for 30 seconds. When the thickness of the film was remeasured, film loss was not occurred.

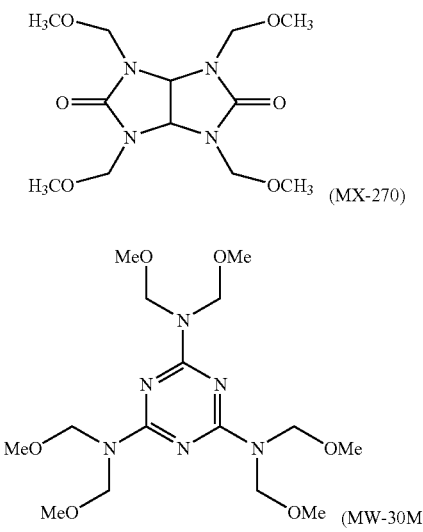

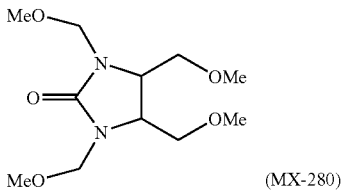

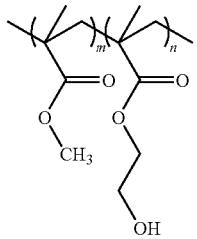

(Weight-average molecular weight: 11,500, m:n=70:30)

TABLE 1

|  | Polymer | Crosslinker | Acid generator | solvent | Refractive index (n) | absorbance (k) | Forming patterns |
| --- | --- | --- | --- | --- | --- | --- | --- |
| Example 2-1 | Formula 6a | Formula 7a (MX-270) | — | PGMEA | 1.67 | 0.29 | possible |
| Example 2-2 | Formula 6b | Formula 7a (MX-270) | — |  | 1.67 | 0.30 | possible |
| Example 2-3 | Formula 6c | Formula 7c (MX-280) | — |  | 1.78 | 0.30 | possible |
| Example 2-4 | Formula 6c | Formula 7b (MW-30M) | — |  | 1.78 | 0.28 | possible |
| Example 2-5 | Formula 6d | Formula 7b (MW-30M) | — |  | 1.80 | 0.25 | possible |
| Comparative Example 1-1 | Formula 9 | Formula 7a (MX-270) | Formula8 (TAG-2678) |  | 1.67 | 0.25 | impossible |
| Comparative Example 1-2 | Formula 9 | Formula 7b (MW-30M) | Formula8 (TAG-2678) |  | 1.73 | 0.27 | impossible |

As shown in the Table 1, the organic anti-reflective coating layer prepared by the composition of the present invention has superior refractive index (n) and absorbance (k), and there is low film loss (the loss of the thickness of layer), and strip resistance is good. Conventionally, if the value of k is low at any wavelength (for example, k<0.2), standing wave and notching are occurred by diffused reflection, which negatively effect on the formation of pattern profile, and if the value of k is high at any wavelength (for example, k>0.7), the absorbance increase, and the sensitivity of photoresist is effected, and the production efficiency of semi-conductor devices may be deteriorated.

The polymer for forming an organic anti-reflective coating layer and the composition including the same according to the present invention, has a characteristic that a small scale molecular structure which can be changed to the molecular structure soluble in developer by acid is introduced in the polymer chain. Therefore an etching process of the anti-reflective coating layer can be eliminated because the formation of molecular scale fine patterns is available and the anti-reflective coating layer is soluble in alkali solutions and can be patterned with photoresist. Therefore, the loss which can be occurred in an etching process can be reduced, and the thinner layer of photoresist and fine patterning is available. Moreover, in the etching process of substrate, the difficulty of etching is reduced, and the above stated process is more advantageous in view of the process and cost over the process of an conventional anti-reflective coating layer, and can be applied at all the processes using chemically amplified resist with acid degradable polymer.

The invention claimed is:

1. A polymer for forming an organic anti-reflective coating layer represented by following Formula 1,

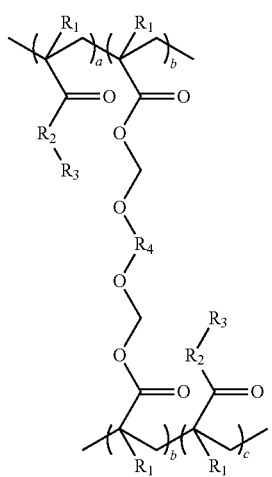

[Formula 1]

wherein $R_1$ is a hydrogen atom (H) or a methyl group (—$CH_3$), $R_2$ is a sulfur atom (S) or an oxygen atom (O), $R_3$ is a group containing 1 to 20 carbon atoms and a terminal hydroxyl group, $R_4$ is an alkylene group or a cycloalkylene group, wherein, a hetero atom is contained therein, and a, b and c independently represent weight % of repeating units constituting the polymer, and are 1 to 98 weight %, 1 to 98 weight %, and 1 to 98 weight %, respectively.

2. The polymer for forming an organic anti-reflective coating layer of claim 1, wherein the polymer is for an organic anti-reflective coating layer which is soluble in alkali solution.

3. The polymer for forming an organic anti-reflective coating layer of claim 1, wherein $R_3$ is a linear, a branched or a cyclic alkyl group of 1 to 20 carbon atoms, containing a hydroxyl group (—OH), and optionally, a hetero atom is contained therein.

4. The polymer for forming an organic anti-reflective coating layer of claim 1, wherein $R_4$ is a linear, a branched or a cyclic alkylene group of 1 to 20 carbon atoms, wherein, a hetero atom is contained therein.

5. The polymer for forming an organic anti-reflective coating layer of claim 1, wherein $R_4$ is selected from a group consisting of

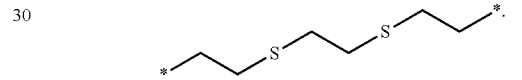

6. The polymer for forming an organic anti-reflective coating layer of claim 1, wherein the weight-average molecular weight of the polymer is 1,000 to 100,000.

* * * * *